United States Patent
Midya et al.

(10) Patent No.: US 7,777,563 B2
(45) Date of Patent: Aug. 17, 2010

(54) SPREAD SPECTRUM PULSE WIDTH MODULATION METHOD AND APPARATUS

(75) Inventors: Pallab Midya, Palatine, IL (US); William J. Roeckner, Carpentersville, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 49 days.

(21) Appl. No.: 12/338,279

(22) Filed: Dec. 18, 2008

(65) Prior Publication Data

US 2010/0156527 A1 Jun. 24, 2010

(51) Int. Cl.
*H03F 3/38* (2006.01)
(52) U.S. Cl. .......................................... 330/10; 330/251
(58) Field of Classification Search ................... 330/10, 330/251, 207 A
See application file for complete search history.

(56) References Cited

U.S. PATENT DOCUMENTS

| | | | |
|---|---|---|---|
| 5,973,556 A * | 10/1999 | Su | ................................ 330/10 |
| 6,414,613 B1 | 7/2002 | Midya et al. | |
| 6,765,436 B1 * | 7/2004 | Melanson et al. | ............. 330/10 |
| 6,819,912 B2 | 11/2004 | Roeckner et al. | |
| 7,130,346 B2 | 10/2006 | Midya et al. | |
| 7,667,552 B2 * | 2/2010 | Midya et al. | ................. 332/106 |
| 2008/0252392 A1 | 10/2008 | Midya et al. | |

* cited by examiner

*Primary Examiner*—Henry K Choe
(74) *Attorney, Agent, or Firm*—Vedder Price P.C.

(57) ABSTRACT

A circuit includes a variable frequency generator circuit and a quantization circuit. The variable frequency generator circuit provides a discontinuous switching frequency signal. The variable frequency generator circuit varies the discontinuous switching frequency signal between a first and second frequency while avoiding at least one frequency band between the first and second frequency. The quantization circuit provides a plurality discrete switching signals each separated by a second frequency band that vary in accordance with the discontinuous switching frequency signal, wherein the avoided frequency band of the discontinuous switching frequency signal is greater than the second frequency band.

20 Claims, 8 Drawing Sheets

FIG. 2

SPREAD SPECTRUM PULSE WIDTH MODULATION METHOD AND APPARATUS

BACKGROUND

1. Field

This disclosure relates generally to audio amplifiers, and more specifically, to a method and apparatus for generating a discrete noise-shaped variable switching frequency signal.

2. Related Art

In class D audio amplifiers, digital pulse width modulation (PWM) can be used to convert a digital signal into a series of pulses based on a switching frequency. The switching frequency can be quantized by a high frequency system clock. The switching frequency is typically fixed, which produces discrete tones in the signal spectrum located at the switching frequency and its harmonics. These discrete tones are undesirable since they can produce electromagnetic interference (EMI). In communication applications, the discrete tones may exceed EMI regulations. Furthermore, in audio amplifier applications used in conjunction with a radio system (e.g., an AM or FM radio), the discrete tones can interfere with the receive channel distorting the information to be amplified, which is undesirable.

Various methods have been used to reduce EMI. For example, low pass filters have been used to reduce EMI. However using low pass filters in amplifiers can increase the size and cost of the amplifiers, which is undesirable. Another method to reduce EMI is frequency dithering. However, frequency dithering is more suitable for analog PWM since the switching frequency can be varied in a continuous fashion. In digital PWM, the switching frequency is based on counting the system clock and therefore the switching frequencies are discrete and tonal. Moreover, in class D audio amplifier applications, the high frequency system clock may be generated from a high accuracy low noise crystal reference, and performing frequency dithering on the reference clock may produce noise in the audio band.

Although dithering the switching frequency can effectively reduce overall EMI amplitudes, it broadens the frequency range of spectral content increasing the range of possible radio frequency interference, which is undesirable.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
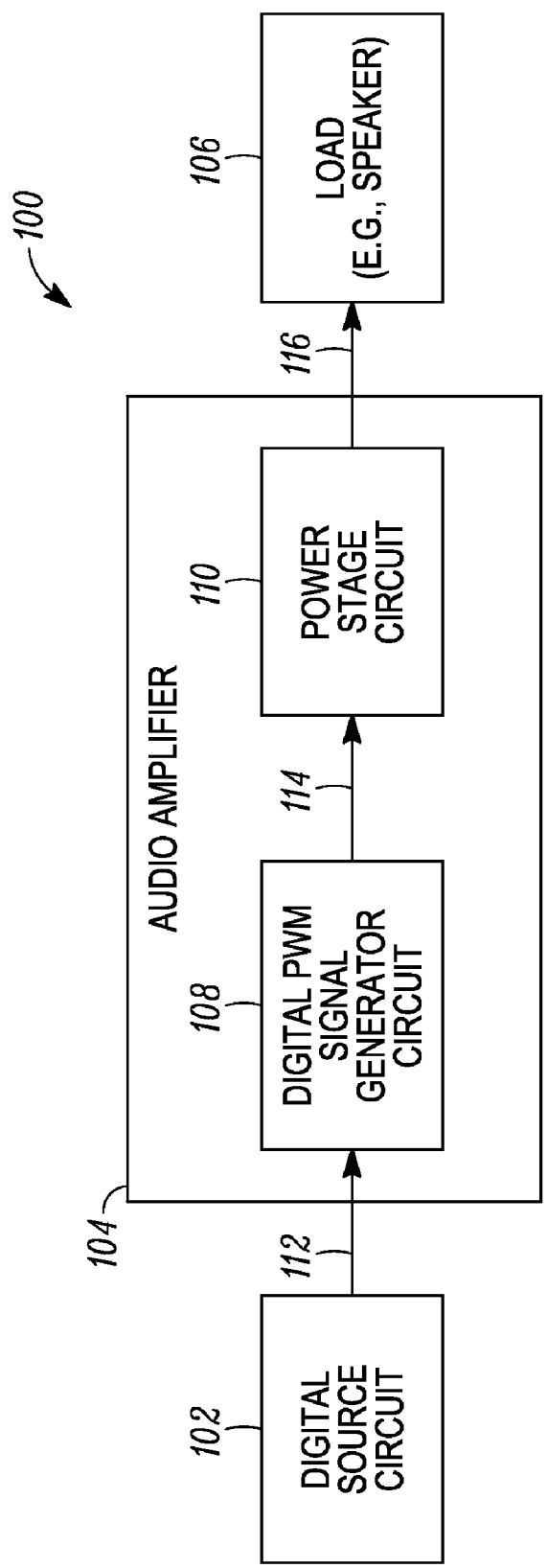
FIG. 1 is an exemplary functional block diagram of an audio device using a digital pulse width modulation signal generator circuit according to the present disclosure.

In one example, a circuit includes a variable frequency generator circuit and a quantization circuit. The variable frequency generator circuit provides a discontinuous switching frequency signal that varies between a first and second frequency while avoiding at least one frequency band between the first and second frequency. Varying the switching frequency signal between the first and second frequency spreads any electromagnetic interference (EMI) between the first and second frequency, which effectively reduces the overall EMI of the switching frequency signal. In addition, by avoiding one or more frequency bands between the first and second frequency, EMI can be further reduced at desired frequencies to reduce any possible interference with wireless communication channels. The quantization circuit provides a plurality of discrete switching signals each separated by a second frequency band that vary in accordance with the discontinuous switching frequency signal, where the avoided frequency band is greater than the second frequency band. The discrete switching signal can be used to convert a digital signal (e.g., a pulse code modulated or pulse density modulated signal) into a pulse width modulated signal, which can be used to drive a load such as a speaker.

In another example, the variable frequency generator circuit can include a linear frequency generator circuit. The linear frequency generator circuit provides a discontinuous linear switching frequency signal that varies between the first and second frequency and that has a discontinuity corresponding to the avoided frequency band. The linear frequency generator circuit can include an up-down counter circuit to provide the linear switching frequency waveform for example.

In yet another example, the frequency generator circuit can include a non-linear modifier circuit. The non-linear modifier circuit provides the discontinuous switching frequency signal based on the linear switching frequency waveform and a non-linear factor. As such, the discontinuous switching frequency signal is a non-linear waveform in this example, which can exhibit reduced EMI.

In still another example, the linear frequency generator circuit can include a discontinuity circuit. The discontinuity circuit provides the discontinuity in the discontinuous switching frequency signal corresponding to the avoided frequency band. For example, when the discontinuous switching frequency signal approaches an edge of the avoided frequency band, the discontinuity circuit can skip that frequency band thereby providing the discontinuity corresponding to the avoided frequency band.

As used herein, the terms "circuit" and "module" can include one or more processors (e.g., shared, dedicated, or group of processors such as but not limited to microprocessors, DSPs, or central processing circuits) and memory that execute one or more software or firmware programs, electronic circuits, integrated circuits, combinational logic circuits, FPGAs, ASICs, state machines, and/or other suitable components that provide the described functionality. In addition, the term "signal" may refer to analog or digital information.

Referring now to FIG. 1, an audio device 100 such as a CD player, a DVD player, a media player, a radio, and/or any other suitable audio device is depicted. The audio device 100 can include a digital source circuit 102, an audio amplifier circuit 104 (e.g., a class D audio amplifier), and a load 106 such as an audio speaker for example. The audio amplifier 104 includes a digital pulse width modulation (PWM) signal generator circuit 108 and a power stage circuit 110.

The digital source circuit 102 provides a digital signal 112 to the digital PWM signal generator circuit 108 based on digital information received wirelessly and/or stored on a medium such as a compact disc, memory, hard disk, and/or other suitable medium. The digital signal 112 can be in the form of a pulse code modulated (PCM) signal, a pulse density modulated (PDM) signal, and/or any other suitable digital signal capable of communicating audio information.

The digital PWM signal generator circuit 108 provides a digital PWM signal 114 in response to the digital signal 112. As will be discussed in more detail, the switching frequency of the digital PWM signal 114 varies between a first and second frequency while avoiding one or more frequency bands between the first and second frequency. In this manner, electromagnetic interference (EMI) can be reduced, particularly at frequency bands that correspond with particular wireless communication channels such as AM radio channels, FM radio channels, and/or other suitable wireless communication channels.

The power stage circuit 110 amplifies the digital PWM signal 114 and provides an amplified digital PWM signal 116 based thereon. The amplified digital PWM signal 116 drives the load 106. In one example, the load 106 produces an audible output in response to the amplified digital PWM signal 116.

Figure 2:
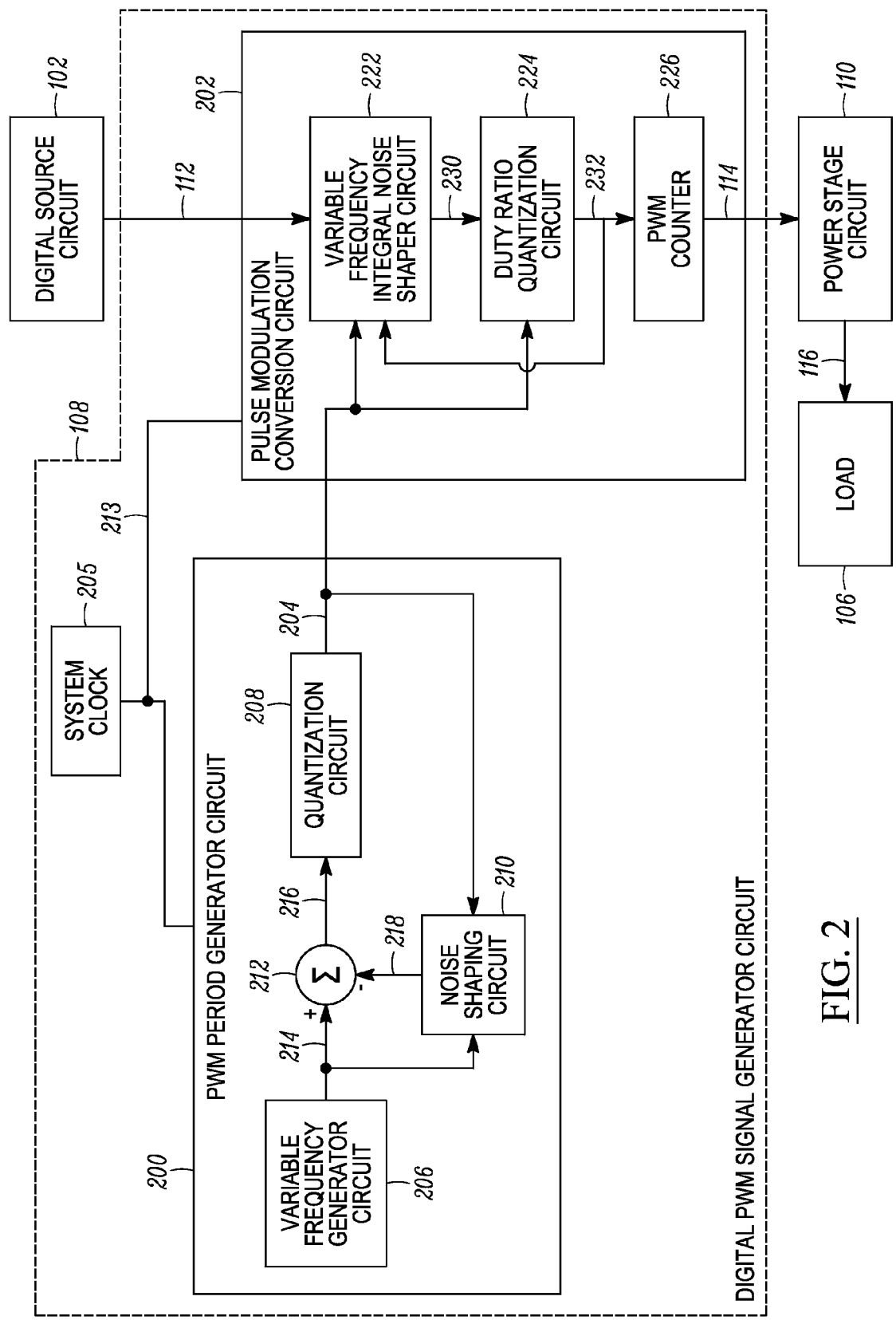
FIG. 2 is an exemplary functional block diagram of a pulse width modulation period generator circuit and a pulse modulation conversion circuit of the pulse width modulation signal generator circuit.

Referring now to FIG. 2, an exemplary functional block diagram of the digital PWM signal generator circuit 108 is depicted. The digital PWM signal generator circuit 108 includes a PWM period generator circuit 200 and a pulse modulation conversion circuit 202. The pulse modulation conversion circuit 202 provides the digital PWM signal 114 in response to the digital signal 112 (e.g., PCM or PDM signal) and a discrete switching frequency signal 204. The PWM period generator circuit 200 provides the discrete switching frequency signal 204 as a function of a system clock 205. The discrete switching frequency signal 204 varies between a first frequency (e.g., a maximum switching frequency such as 400 kHz) and second frequency (e.g., a minimum switching frequency 320 kHz) while avoiding one or more frequency bands (e.g., that correspond to AM or FM radio channels) between the first and second frequency. In this manner, EMI can be reduced and in some cases eliminated at the avoided frequency bands. The digital PWM signal 114 varies in accordance with the discrete switching frequency signal 204 and hence has reduced spectral energy corresponding to the one or more frequency bands avoided.

The PWM period generator circuit 200 includes a variable frequency generator circuit 206, a quantization circuit 208, a noise shaping circuit 210, and a summer circuit 212. The variable frequency generator circuit 206 is coupled with the summer circuit 212 and the noise shaping circuit 210, the summer circuit 212 is coupled with the quantization circuit 208, and the quantization circuit 208 is coupled with the noise shaping circuit 210. As used herein, the phrase "coupled with" is defined to mean directly connected to or indirectly connected through one or more intermediate components. Such intermediate components can include hardware components, software based components, or both.

The PWM period generator circuit 200 can be triggered by a system clock signal 213 that may be defined by a rising-edge, falling-edge, half-cycles, or other triggering based on the clock cycle. The variable frequency generator circuit 206 provides a discontinuous switching frequency signal 214. In one example, the variable frequency generator circuit 206 provides the discontinuous switching frequency signal 214 as a function of the system clock 205. The discontinuous switching frequency signal 214 varies between a first and second frequency while avoiding at least one frequency band between the first and second frequency. The avoided frequency band can correspond to an AM radio channel, for example, and/or other suitable wireless communication channel.

In one embodiment, the discontinuous switching frequency signal 214 is a digital representation and can be represented in as many bits as allowed by a processor used by the PWM period generator circuit 200. The discontinuous switching frequency signal 214 can be as accurate as possible and include no granularity with respect to the number of bits available. In one embodiment, the PWM period generator circuit 200 can use a 24-bit processor and the discontinuous switching frequency signal 214 can have 24-bit accuracy. In another embodiment, the PWM period generator circuit 200 can use a 48-bit processor and the discontinuous switching frequency signal 214 can have 48-bit accuracy. Other processors and signal accuracies may be used by the PWM period generator circuit 200. In another embodiment, the discontinuous switching frequency signal 214 can have granularity with respect to the processor (e.g., the PWM period generator circuit 200 can use a 24-bit processor and the discontinuous switching frequency signal 214 can be at 20-bit accuracy) depending on the application in which the PWM period generator circuit 200 is implemented.

Figure 3:
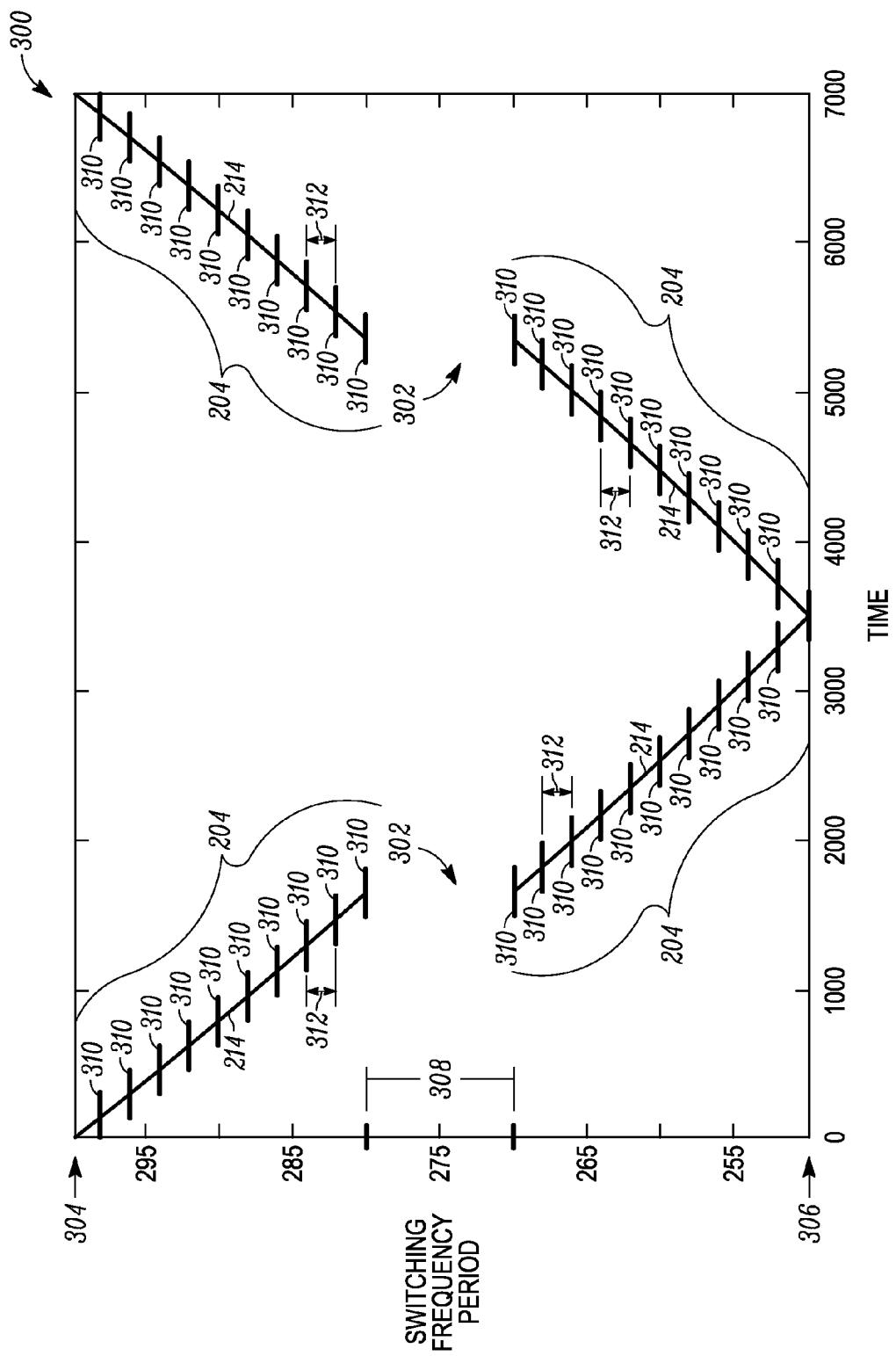
FIG. 3 is an exemplary waveform of a discontinuous variable switching frequency waveform according to the present disclosure.

The variable frequency generator circuit 206 can comprise a signal generator, a function generator, or other frequency generating component that is operable to generate a discontinuous variable switching frequency waveform 300 as shown in FIG. 3. As shown the discontinuous variable switching frequency waveform 300 has a discontinuity 302 and varies between a first frequency 304 and a second frequency 306. Furthermore, as shown, the discontinuous switching frequency 214 provided by the variable frequency generator circuit 206 varies between the first frequency 304 and the second frequency 306 while avoiding one or more frequency bands 308 between the first and second frequency 304, 306.

In FIG. 3, the discrete switching signal 204 is plotted along with the discontinuous switching frequency 214. As shown, the discrete switching signal 204 includes a plurality of discrete switching signals 310. Each of the discrete switching signals 310 are separated by a frequency band 312 that is less than the avoided frequency band(s) 308. In one embodiment, each frequency band 312 can be approximately equal. In other embodiments, each frequency band 312 can vary. However, in both embodiments the avoided frequency band(s) 308 is greater than the frequency band 312 separating the discrete switching signals 310.

This switching frequency waveform 300 can be pre-determined to produce a desired PWM spectrum, e.g. a PWM spectrum having a substantially flat spectrum with a further reduced spectrum (e.g., a spectral null) corresponding to one or more avoided frequency bands 308. In one embodiment, the variable frequency generator circuit 206 can be programmed to generate a predefined switching frequency waveform having one or more discontinuities 302 corresponding to the one or more avoided frequencies 308. In another embodiment, the variable frequency generator circuit 206 can automatically generate the switching frequency waveform 300 as a function of a look-up table. The look-up table can be stored in memory, either internal or external to the variable frequency generator circuit 206. The look-up table can include values such as the starting frequency, the desired switching frequency band including the lowest switching frequency and the highest switching frequency, the rate of sweep of the waveform, the waveform amplitude, the frequency band(s) to avoid, and/or other values that may be used to generate and/or define the waveform.

The variable frequency generator circuit 206 can use the values stored in the look-up table, in combination with a system clock, to generate the switching frequency waveform 300 having one or more discontinuities 302 corresponding to the avoided frequency bands 308 as a function of a linear periodic function, a nonlinear function, or combinations thereof. The linear periodic function can be a triangular function, a saw-tooth function, or other linear periodic function. The nonlinear function can be a polynomial function, a sinusoidal function, or other nonlinear function. For example, if the switching frequency waveform is selected to have a starting frequency of 125 kHz, a desired switching frequency band ranging from 125 kHz to 150 kHz, a sweep rate of 20 Hz, and a given amplitude, in combination with a system clock of 16 MHz, the variable frequency generator circuit 206 can generate the switching frequency waveform 300.

In this example, the switching frequency waveform 300 is comprised of a linear combination of a triangle and a quadratic function having one or more discontinuities, although other combinations of linear periodic function(s) and/or nonlinear function(s) can be used if desired. In addition, the combination of a linear periodic function and a nonlinear function may produce a more flat PWM spectrum at the switching frequency than a purely linear periodic function or a purely nonlinear function.

The variable frequency generator circuit 206 can define a switching frequency sample on the switching frequency waveform 300 as a function of the system clock 205. This sample corresponds to the current value of the switching frequency waveform 300 at a particular clock cycle. For example, in a first clock cycle, the switching frequency sample may equal 125.9 kHz, in a second clock cycle, the switching frequency sample may equal 126 kHz, in a third clock cycle, the switching frequency sample may equal 126.1 kHz, and so on. The variable frequency generator circuit 206 can output switching frequency samples at every clock cycle, every other clock cycle, every third clock cycle, or at some other time determinable by the system clock. The variable frequency generator circuit 206 may output discontinuous switching frequency signal 214. Over a range of clock cycles, the discontinuous switching frequency signal 214 can represent switching frequency samples that are variable as a function of the switching frequency waveform 300.

Referring back to FIG. 2, the quantization circuit 208 can comprise a digital logic circuit or other suitable circuit operable to quantize a digital signal. Upon initialization of the PWM period generator circuit 200 (e.g., power-up, restart, reboot, reset, or other initializations) no quantization noise generated from a previous clock cycle will be available to the PWM period generator circuit 200. As a result, the quantization circuit 208 can quantize the discontinuous switching frequency signal 214 without correction of noise. As will be described below, when quantization noise is detected by the noise shaping circuit 210 and added to the discontinuous switching frequency signal 214, the quantization circuit 208 can quantize a corrected discontinuous switching frequency signal 216. Hereinafter, for explanation purposes, the quantization circuit 208 will be described as quantizing the corrected discontinuous switching frequency signal 216 after initialization.

The quantization circuit 208 quantizes the discontinuous corrected switching frequency signal 216 to a set of discrete values (i.e., quantization levels, determined as a function of the fixed frequency system clock) and provides a discrete switching frequency signal 204 based thereon. The discrete switching frequency signal 204 is thereby limited to one of the quantization levels utilized by the quantization circuit 208. Each quantization level represents one of the discrete switching signals 310 that can be used to define the digital PWM period. Because the quantization levels are discrete and limited to frequencies realizable by the system clock, the discrete switching frequency signal 204 may be represented by a lesser number of bits than the discontinuous switching frequency signal 214. For example, the discrete switching frequency signal 204 can be a 7-bit number representing the particular quantization levels utilized by the quantization circuit 208, although a greater or lesser number of bits, e.g. 8-bits, 6-bits, or other number of bits, can be used by the PWM period generator circuit 200.

The noise shaping circuit 210 determines the quantization error produced by the quantization circuit 208 as a function of the discontinuous switching frequency signal 214 and the discrete switching frequency signal 204 in a given clock cycle and provides a quantization error signal 218 base thereon. The quantization error introduces quantization noise in the PWM period generator circuit 200, which may increase in proportion to the difference between the two signals 214, 204. As a result, for higher quality applications, the number of quantization levels may be increased to reduce quantization noise. The noise shaping circuit 210 receives as inputs the discontinuous switching frequency signal 214 and the discrete switching frequency signal 204, and compares the two signals to determine the amount of quantization noise produced by the quantization circuit 208. The noise shaping circuit 210 can store the quantization noise until a future clock cycle (e.g., an immediate subsequent clock cycle) and provide the quantization noise, represented by the quantization error signal 218, to the summer circuit 212.

The summer circuit 212 adds the quantization noise represented by the quantization error signal 218 to the discontinuous switching frequency signal 214 to generate the corrected discontinuous switching frequency signal 216. The corrected discontinuous switching frequency signal 216 is input to the quantization circuit 208 for quantization. By adding the quantization noise to the current switching frequency signal 214, the PWM period generator circuit 200 can eliminate or reduce the discrete tones that would otherwise appear at the switching frequencies of the PWM signal spectrum.

In one embodiment, the pulse modulation conversion circuit 202 includes a variable frequency integral noise shaper circuit 222, a duty ratio quantization circuit 224, and a PWM counter 226. A similar pulse modulation conversion circuit 202 is described in commonly assigned U.S. Pat. No. 7,130,346, filed on May 14, 2004, entitled "Method and Apparatus Having a Digital PWM Signal Generator with Integral Noise Shaping," which is incorporated herein by reference in its entirety.

During operation, the variable frequency integral noise shaper circuit 222 receives as input the digital signal 112, the discrete switching frequency signal 204, the system clock signal 213, and a quantized duty ratio signal 232. The variable frequency integral noise shaper circuit 222 generates an unquantized duty ratio, represented by unquantized duty ratio signal 230. The variable frequency integral noise shaper circuit 222 takes the integral of the difference between the digital signal 112 and the quantized duty ratio signal 232 during a particular clock cycle. In one embodiment, the integrals are computed in closed-form in the digital domain to generate the unquantized duty ratio signal 230. The unquantized duty ratio signal 230 is generated such that the PWM signal 114 mirrors the signal content of the digital input 112 within the audio band.

The duty ratio quantization circuit 224 receives as input the unquantized duty ratio signal 230, the discrete switching frequency signal 204, and the system clock signal 213. The duty ratio quantization circuit 224 quantizes the unquantized duty ratio signal 230 to some smaller number of bits such that the duty ratio signal 230 can be realizable with the fixed frequency of the system clock 205. The duty ratio quantization circuit 224 outputs a quantized duty ratio, represented by the quantized duty ratio signal 232. The PWM counter 226 receives as input the quantized duty ratio signal 232 and the system clock signal 213 and outputs the PWM signal 114. In one embodiment, the PWM counter 226 is a 7-bit counter, although other counters are contemplated. The power stage 110 receives as inputs the PWM signal 114 and outputs the amplified PWM signal 116 to the load 106.

Figure 4:
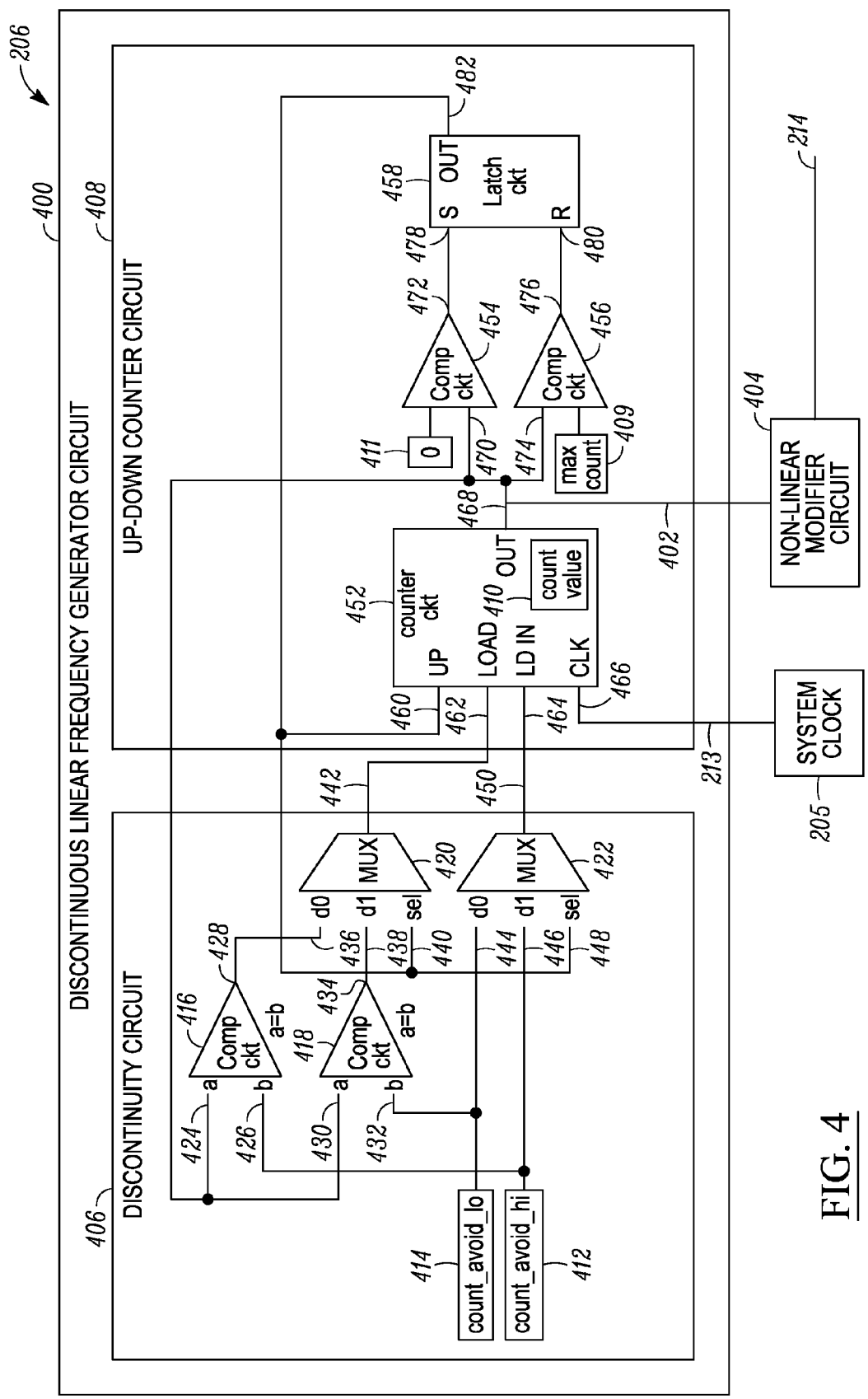
FIG. 4 is an exemplary functional block diagram of a discrete variable frequency generator circuit of the pulse width modulation period generator circuit.

Referring now to FIG. 4, an exemplary functional block diagram of the variable frequency generator circuit 206 is depicted. The variable frequency generator circuit 206 includes a discontinuous linear frequency generator circuit 400. The discontinuous linear frequency generator circuit 400 provides, as a function of the system clock 205, a discontinuous linear switching signal 402 such as the switching frequency waveform 300 as shown in FIG. 3 that varies between the first and second frequency 304, 306 and that has one or more discontinuities 302 corresponding to the one or more avoided frequencies 308. As such, in some embodiments, the discontinuous linear switching signal 402 can correspond to the discontinuous switching frequency signal 214.

Figure 5:
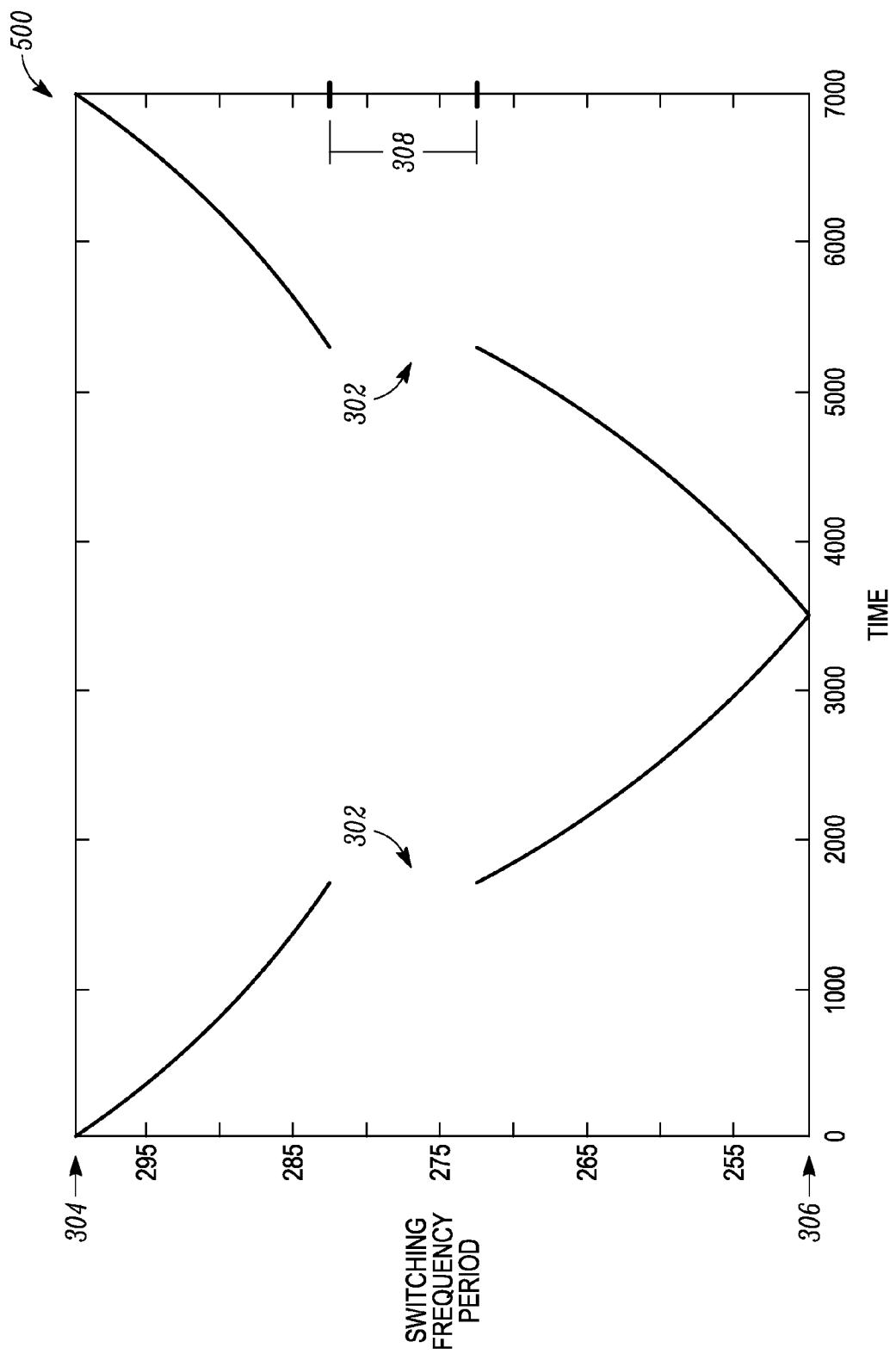
FIG. 5 is an exemplary waveform of a non-linear discontinuous linear switching waveform according to the present disclosure.

In some embodiments, the variable frequency generator circuit 206 can also include a non-linear modifier circuit 404 to further modify the EMI spectral shape. In these embodiments, the non-linear modifier circuit 404 provides a non-linear discontinuous switching waveform 500 based on the discontinuous linear switching waveform 300 similar to the exemplary waveform depicted in FIG. 5. In some embodiments, the non-linear discontinuous switching waveform 500 can be based on a non-linear function having a non-linear factor that can be used to adjust the non-linearity of the waveform 500. In these embodiments, the non-linear discontinuous switching waveform 500 can correspond to the discontinuous switching frequency signal 214.

Referring back to FIG. 4, in one example, the discontinuous linear frequency generator circuit 400 can include a discontinuity circuit 406 and an up-down counter circuit 408. The up-down counter circuit 408 increments or decrements a count value 410, which corresponds to the discontinuous linear switching signal 402, in response to a system clock. More specifically, the up-down counter circuit 408 increments the count value 410 to a maximum count value 409 and decrements the count value 410 to a minimum count value 411 (e.g., zero) in response to the system clock 205. As such, in this example, the discontinuous switching frequency waveform 300 is based on the count value 410.

The discontinuity circuit 406 provides the discontinuity 302 corresponding to the one or more avoided frequency bands 308 in response to the count value 410 transcending a low frequency avoid threshold value 412 or a high frequency avoid threshold value 414. The discontinuity circuit 406 can include a first comparator circuit 416, a second comparator circuit 418, a first multiplexer circuit 420, and a second multiplexer circuit 422.

The first comparator circuit 416 includes a first input terminal 424, a second input terminal 426, and a first output terminal 428. The second input terminal 426 receives the low frequency avoid threshold value 412. The second comparator 418 circuit includes a third input terminal 430, a fourth input terminal 432, and a second output terminal 434. The third input terminal 430 is operatively coupled to the first input terminal 424. The fourth input terminal 432 is operative to receive the high frequency avoid threshold value 414.

The first multiplexer circuit 420 includes a fifth input terminal 436, a sixth input terminal 438, a seventh input terminal 440, and a third output terminal 442. The fifth input terminal 436 is operatively coupled to the first output terminal 428. The sixth input terminal 438 is operatively coupled to the second output terminal 434. The second multiplexer circuit 422 includes an eighth input terminal 444, a ninth input terminal 446, a tenth input terminal 448, and an fourth output terminal 450. The eighth input terminal 444 is operatively coupled to the fourth input terminal 432. The ninth input terminal 446 is operatively coupled to the second input terminal 426. The tenth input terminal 448 is operatively coupled to the seventh input terminal 440.

In one example, the up-down counter circuit 408 can include a counter circuit 452, a third comparator circuit 454, a fourth comparator circuit 456, and a latch circuit 458. The counter circuit 452 includes an eleventh input terminal 460, a twelfth input terminal 462, a thirteenth input terminal 464, a fourteenth input terminal 466, a fifth output terminal 468. The twelfth input terminal 462 is operatively coupled to the third output terminal 442. The thirteenth input terminal 464 is operatively coupled to the fourth output terminal 450. The fourteenth input terminal 466 is operative to receive the clock signal 213. The fifth output terminal 468 is operatively coupled to the first input terminal 424.

The eleventh input terminal 460 controls whether the counter circuit 452 counts up or counts down. For example, in one embodiment, when the eleventh input terminal 460 receives a logical one, the counter circuit 452 counts up and when the eleventh input terminal 460 receives a logical zero, the counter circuit 452 counts down or vice versa. In addition, the thirteenth input terminal 464 controls the output (e.g., the discontinuous linear switching signal 402) of the fifth output terminal 468. For example, in one embodiment, when the thirteenth input terminal 464 receives a logical one, the output of the fifth output terminal 468 is based on the input of the twelfth input terminal 462 and when the thirteenth input terminal 464 receives a logical zero, the output of the fifth output terminal 468 is based on the count value 410 or vice versa.

The third comparator circuit 454 includes a fifteenth input terminal 470 and a sixth output terminal 472. The fifteenth input terminal 470 is operatively coupled to the fifth output terminal 468. The fourth comparator circuit 456 includes a sixteenth input terminal 474 and a seventh output terminal 476. The sixteenth input terminal 474 is operatively coupled to the fifth output terminal 468.

The latch circuit includes a seventeenth input terminal 478, an eighteenth input terminal 480, and an eighth output terminal 482. The seventeenth input terminal 478 is operatively coupled to the sixth output terminal 472. The eighteenth input terminal 480 is operatively coupled to the seventh output terminal 476. The eighth output terminal 482 is operatively coupled to the seventh input terminal 440 and the eleventh input terminal 460.

Figure 6:
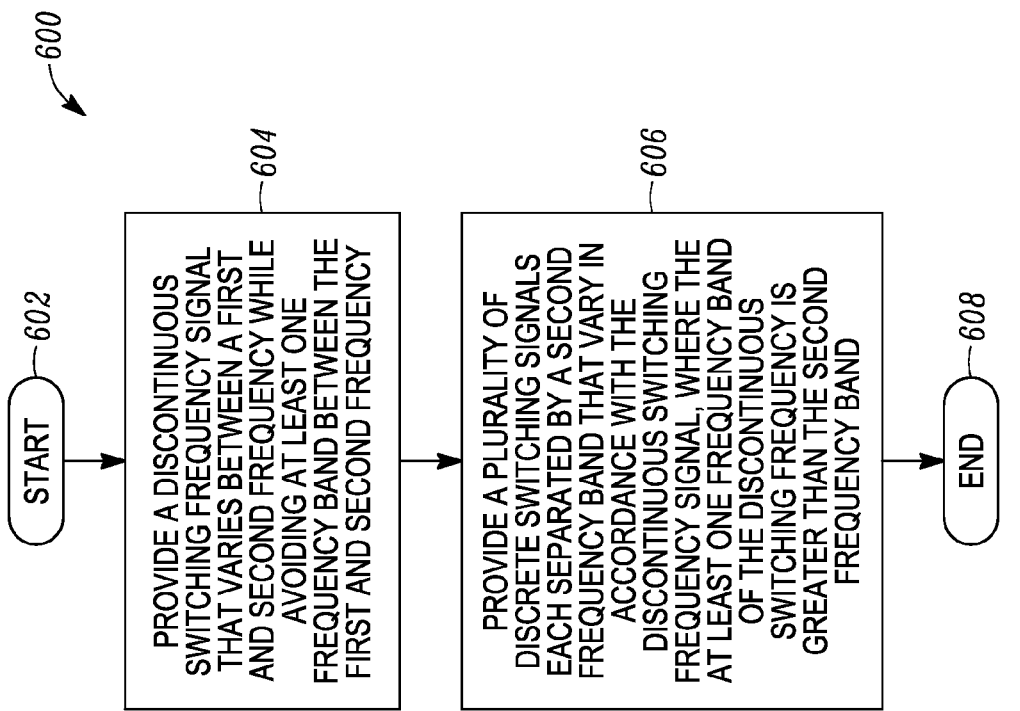
FIG. 6 is an exemplary flowchart depicting operations that can be performed by the pulse width modulation period generator circuit.

Referring now to FIG. 6, exemplary operations that can be performed by the PWM period generator circuit 200 are generally identified at 600. The process starts at 602. At 604, the variable frequency generator circuit 206 provides the discontinuous switching frequency signal 214 that varies between a first and second frequency 304, 306 while avoiding at least one frequency band 308 between the first and second frequency 304, 306. At 606, the quantization circuit 208 provides the discrete switching signal 204 that varies in accordance with the discontinuous switching frequency signal 214. The process ends in at 608.

Figure 7:
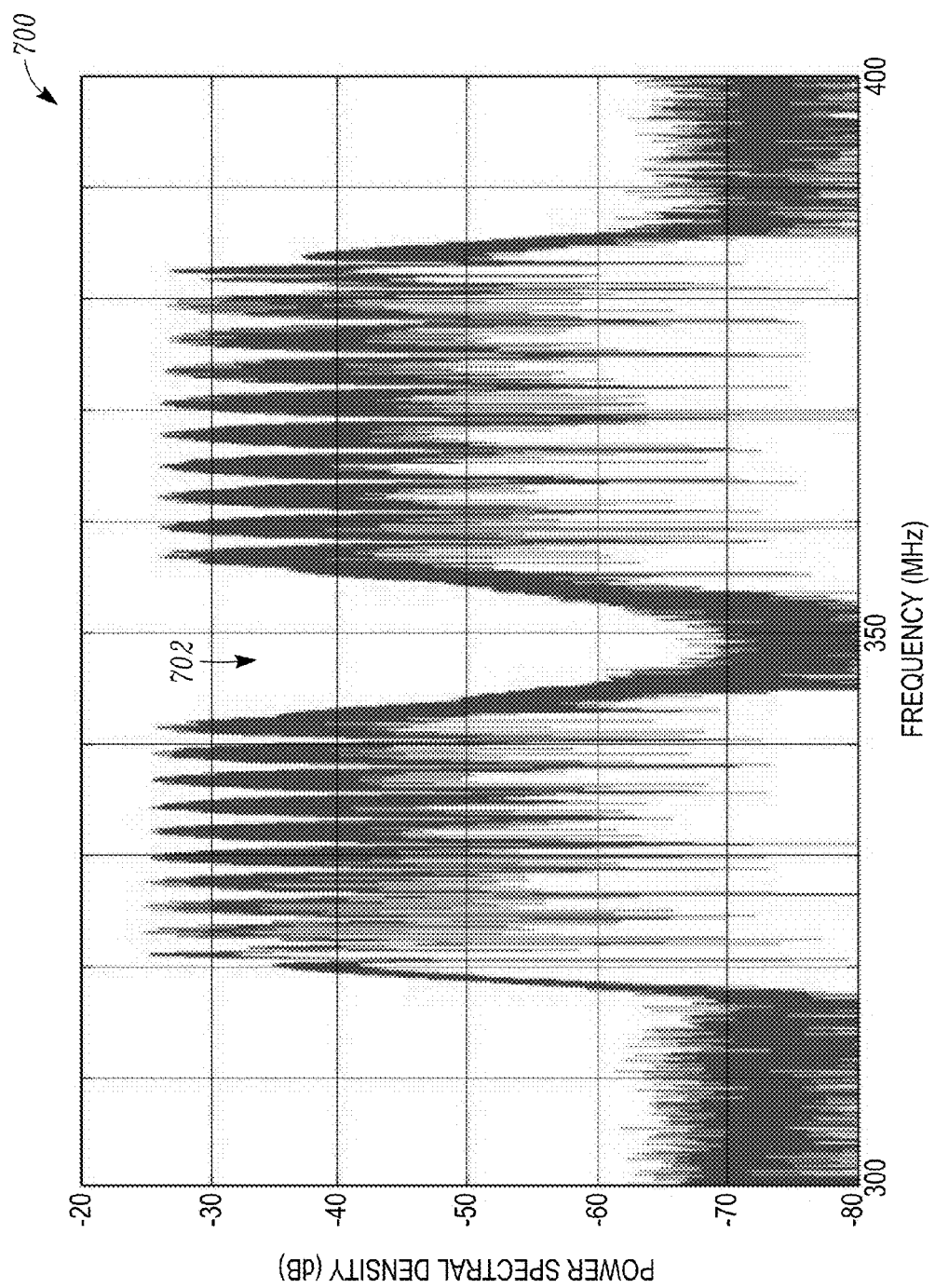
FIG. 7 is an exemplary depiction of power spectral density of a discrete switching frequency signal provided by the pulse width modulation period signal generator circuit.
Figure 8:
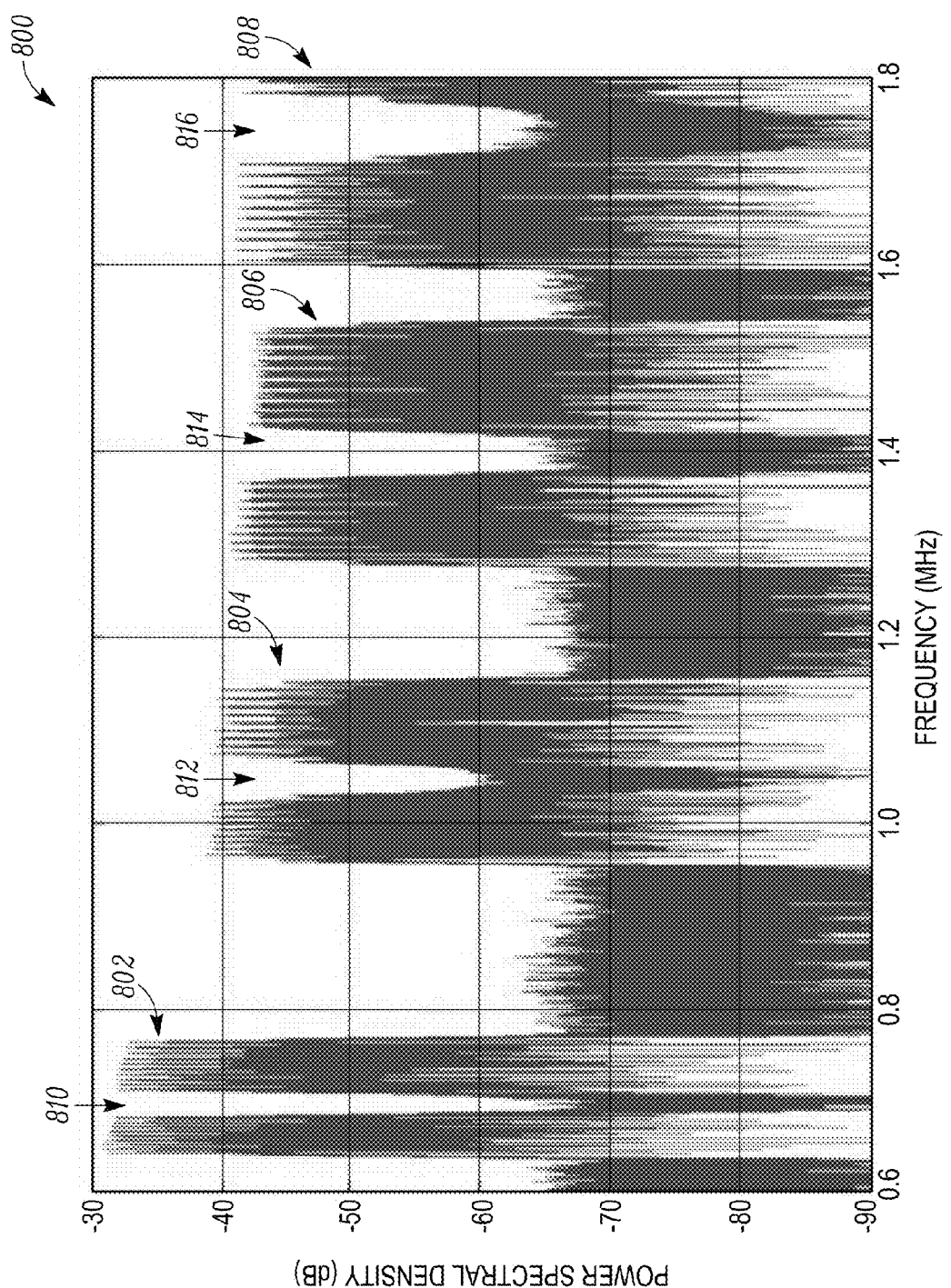
FIG. 8 is an exemplary depiction of power spectral density of harmonics of the discrete switching frequency signal.

Referring now to FIG. 7, an exemplary depiction of power spectral density of the discrete switching frequency signal 204 is generally identified at 700. In this example, the avoided frequency band 308 is centered at 350 kHz. As shown, the power spectral density exhibits a reduced spectral density at 702. Accordingly, EMI at 350 kHz is reduced in this example, which reduces interference of wireless communication channels having a carrier frequency centered at 350 kHz. In addition, harmonics of 350 kHz can be reduced as generally identified at 800 in FIG. 8. As shown, a second, third, fourth, and fifth harmonic 802, 804, 806, 808 of the avoided frequency band 308 each exhibits a reduced power spectral density at 810, 812, 814, and 816, respectively. As such, EMI of the discrete switching frequency signal 204 is further reduced at corresponding harmonics of the avoided frequency band 308.

As noted above, among other advantages, variable frequency generator circuit 206 provides a discontinuous switching frequency signal that varies between a first and second frequency while avoiding at least one frequency band between the first and second frequency. Varying the switching frequency signal between the first and second frequency spreads any EMI between the first and second frequency, which effectively reduces the overall EMI of the switching frequency signal. In addition, by avoiding one or more frequency bands between the first and second frequency, EMI can be further reduced at desired frequencies to reduce any possible interference with wireless communication channels. Other advantages will be recognized by those of ordinary skill in the art.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims. In addition, unless stated otherwise, terms such as "first" and "second" are used to arbitrarily distinguish between the elements such terms describe. Thus, these terms are not necessarily intended to indicate temporal or other prioritization of such elements. The term coupled, as used herein, is defined as connected, although not necessarily directly, and not necessarily mechanically. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms a or an, as used herein, are defined as one or more than one.

What is claimed is:

1. A circuit, comprising:
    a variable frequency generator circuit that is operative to provide a discontinuous switching frequency signal and to vary the discontinuous switching frequency signal between a first and second frequency while avoiding at least one frequency band between the first and second frequency; and
    a quantization circuit that is operative to provide a plurality of discrete switching signals each separated by a second frequency band that vary in accordance with the discontinuous switching frequency signal, wherein the at least one frequency band of the discontinuous switching frequency signal is greater than the second frequency band.

2. The circuit of claim 1 wherein the variable frequency generator circuit comprises a linear frequency generator circuit that is operative to provide a discontinuous linear switching frequency signal that varies between the first and second frequency and that has a discontinuity corresponding to the at least one frequency band.

3. The circuit of claim 2 wherein the linear frequency generator circuit further comprises a non-linear modifier circuit that is operative to provide the discontinuous switching frequency signal based on the discontinuous linear switching frequency signal and a non-linear factor.

4. The circuit of claim 2 wherein the linear frequency generator circuit comprises an up-down counter circuit that is operative to one of increment and decrement a count value in response to a clock signal, wherein the discontinuous linear switching frequency signal is based on the count value.

5. The circuit of claim 4 wherein the linear frequency generator circuit further comprises a discontinuity circuit that is operative to provide the discontinuity corresponding to the at least one frequency band in response to the count value transcending a threshold count value.

6. The circuit of claim 5 wherein the discontinuity circuit comprises:
    a first comparator circuit having a first and second input terminal and a first output terminal, wherein the second input terminal is operative to receive a first value corresponding with a first edge of the at least one frequency band;
    a second comparator circuit having a third and fourth input terminal and a second output terminal, wherein the third input terminal is operatively coupled to the first input terminal and the fourth input terminal is operative to receive a second value corresponding with a second edge of the at least one frequency band;
    a first multiplexer circuit having a fifth, sixth, and seventh input terminal and a third output terminal, wherein the fifth input terminal is operatively coupled to the first output terminal, the sixth input terminal is operatively coupled to the second output terminal; and
    a second multiplexer circuit having an eighth, ninth, and tenth input terminal and a fourth output terminal, wherein the eighth input terminal is operatively coupled to the fourth input terminal, the ninth input terminal is operatively coupled to the second input terminal, the tenth input terminal is operatively coupled to the seventh input terminal.

7. The circuit of claim 6 wherein the up-down counter circuit comprises:
    a counter circuit having an eleventh, twelfth, thirteenth, and fourteenth input terminal and a fifth output terminal, wherein the fourteenth input terminal is operative to receive the clock signal and the fifth output terminal is operatively coupled to the first input terminal;

a third comparator circuit having a fifteenth input terminal and a sixth output terminal, wherein the fifteenth input terminal is operatively coupled to the fifth output terminal;

a fourth comparator circuit having a sixteenth input terminal and a seventh output terminal, wherein the sixteenth input terminal is operatively coupled to the fifth output terminal;

a latch circuit having a seventeenth and eighteenth input terminal and a seventh output terminal, wherein the seventeenth input terminal is operatively coupled to the sixth output terminal, the eighteenth input terminal is operatively coupled to the seventh output terminal, and the eighth output terminal is operatively coupled to the seventh input terminal.

8. The circuit of claim 1 further comprising a noise shaping circuit, operatively coupled to the variable frequency generator circuit and the quantization circuit, that is operative to provide a quantization error signal in response to the discrete switching signal and the discontinuous switching frequency signal.

9. The circuit of claim 8 further comprising a summing circuit, operatively coupled to the variable frequency generator circuit, the quantization circuit and the noise shaping circuit, that is operative to provide a corrected switching frequency signal based on a sum of the discontinuous switching frequency signal and the quantization error signal.

10. A method, comprising:

providing a discontinuous switching frequency signal that varies between a first and second frequency while avoiding at least one frequency band between the first and second frequency; and providing a plurality of discrete switching signals each separated by a second frequency band that vary in accordance with the discontinuous switching frequency signal, wherein the at least one frequency band of the discontinuous switching frequency signal is greater than the second frequency band.

11. The method of claim 10 further comprising providing a discontinuous linear switching frequency signal that varies between the first and second frequency and that has a discontinuity corresponding to the at least one frequency band.

12. The method of claim 11 further comprising providing the discontinuous switching frequency signal based on the discontinuous linear switching frequency signal and a non-linear factor.

13. The method of claim 11 further comprising one of incrementing and decrementing a count value in response to a clock signal, wherein the discontinuous linear switching frequency signal is based on the count value.

14. The method of claim 13 further comprising providing the discontinuity corresponding to the at least one frequency band in response to the count value transcending a threshold count value.

15. The method of claim 10 further comprising providing a quantization error signal in response to the discrete switching signal and the discontinuous switching frequency signal.

16. The method of claim 15 further comprising providing a corrected switching frequency signal based on a sum of the discontinuous switching frequency signal and the quantization error signal.

17. An audio device, comprising:

an audio amplifier circuit that comprises:

a pulse modulation period generator circuit that comprises:

a variable frequency generator circuit that is operative to provide a discontinuous switching frequency signal and to vary the discontinuous switching frequency signal between a first and second frequency while avoiding at least one frequency band between the first and second frequency; and a quantization circuit that is operative to provide a plurality of discrete switching signals each separated by a second frequency band that vary in accordance with the discontinuous switching frequency signal, wherein the at least one frequency band of the discontinuous switching frequency is greater than the second frequency band; and a pulse conversion circuit that is operative to provide a pulse modulated signal in response to the discrete switching signal and a digital signal that represents audio information.

18. The audio device of claim 17 wherein the pulse modulation period generator circuit comprises a linear frequency generator circuit that is operative to provide a discontinuous linear switching frequency signal that varies between the first and second frequency and that has a discontinuity corresponding to the at least one frequency band.

19. The audio device of claim 17 wherein the audio amplifier circuit further comprises a power stage circuit, operatively coupled to the pulse modulation period generator circuit, that is operative to provide an amplified pulse modulated signal in response to the pulse modulated signal.

20. The audio device of claim 17 further comprising a digital source circuit that is operative to provide the digital signal based on the audio information.

* * * * *